(12) United States Patent
Murayama et al.

(10) Patent No.: US 9,188,356 B2
(45) Date of Patent: Nov. 17, 2015

(54) AIR CONDITIONING SYSTEM AND METHOD FOR MANAGING SERVER ROOM

(75) Inventors: Dai Murayama, Musashino (JP); Yasuo Takagi, Chigasaki (JP); Yuuichi Hanada, Saitama (JP); Hideyoshi Ootani, Chiba (JP); Tomoyuki Kinoshita, Yokohama (JP); Hiroshi Morimoto, Tokyo (JP); Koubun Takahashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 668 days.

(21) Appl. No.: 13/213,618

(22) Filed: Aug. 19, 2011

(65) Prior Publication Data

US 2011/0306288 A1    Dec. 15, 2011

Related U.S. Application Data

(63) Continuation of application No. PCT/JP2011/060754, filed on May 10, 2011.

(30) Foreign Application Priority Data

May 14, 2010  (JP) ................................ 2010-112560

(51) Int. Cl.
*H05K 7/20*       (2006.01)
*F24F 11/00*      (2006.01)

(52) U.S. Cl.
CPC .......... *F24F 11/0008* (2013.01); *F24F 11/0001* (2013.01); *H05K 7/20745* (2013.01);
(Continued)

(58) Field of Classification Search
CPC ............ F24F 7/06; F24F 11/02; F24F 11/04; F24F 2011/0013; F24F 2011/0016; F24F 12/006; F24F 3/14; F24F 11/0001; F24F 11/0008; H05K 7/20745; H05K 7/20836; H05K 5/0213

USPC ......... 454/184, 187, 224, 229, 231–234, 236, 454/239, 241, 242, 249, 251, 261; 165/224, 165/249, 251, 252
See application file for complete search history.

(56) References Cited

U.S. PATENT DOCUMENTS

2006/0225446 A1*  10/2006  Bash et al. ....................... 62/178
2007/0125107 A1*   6/2007  Beam .............................. 62/186
(Continued)

FOREIGN PATENT DOCUMENTS

| JP | 57-120042   | 7/1982 |
|----|-------------|--------|
| JP | 2000-121131 | 4/2000 |

(Continued)

OTHER PUBLICATIONS

International Search Report issued by the Japanese Patent Office on Aug. 16, 2011, for International Application No. PCT/JP2011/060754.

(Continued)

*Primary Examiner* — Gregory Huson
*Assistant Examiner* — Dana Tighe
(74) *Attorney, Agent, or Firm* — Finnegan, Henderson, Farabow, Garrett & Dunner, L.L.P.

(57) ABSTRACT

According one embodiment, an air-conditioning system is connected to a server room, in which server racks accommodating a plurality of servers are placed between separated first and second spaces, by a return air duct and a supply air duct. In the server room, an airflow is formed so that cold air flown from under the floor into the first space is heated by heat generation of the servers and is flown out from the second space as return air. The system sets control contents for generating supply air within a previously determined supply air temperature target range and a previously determined supply air humidity target range and controls the operation of each device in the system based on the set control contents.

10 Claims, 4 Drawing Sheets

(52) U.S. Cl.
CPC ..... *H05K7/20836* (2013.01); *F24F 2011/0002* (2013.01); *F24F 2011/0013* (2013.01); *F24F 2011/0016* (2013.01)

(56) References Cited

U.S. PATENT DOCUMENTS

| 2008/0185446 A1* | 8/2008 | Tozer | 236/49.4 |
| 2009/0210096 A1* | 8/2009 | Stack et al. | 700/278 |

FOREIGN PATENT DOCUMENTS

| JP | 2002-61911 | 2/2002 |
| JP | 2003-50038 | 2/2003 |
| JP | 2005-172309 | 6/2005 |
| JP | 2007-232312 | 9/2007 |
| JP | 2009-63227 | 3/2009 |
| JP | 2010-14360 | 1/2010 |
| JP | 2010-261696 | 11/2010 |

OTHER PUBLICATIONS

Notification of Reasons for Rejection issued by the State Intellectual Property Office of the People's Republic of China on Nov. 4, 2013, for Chinese Patent Application No. 201180001102, and partial English-language translation thereof.

* cited by examiner

AIR CONDITIONING SYSTEM AND METHOD FOR MANAGING SERVER ROOM

CROSS-REFERENCE TO RELATED APPLICATIONS

This application is based upon and claims the benefit of priority from Japanese Patent Application No. 2010-112560, filed May 14, 2010, which is a continuation application of International Application No. PCT/JP2011/060754, filed May 10, 2011; the entire contents of all of which are incorporated herein by reference.

FIELD

Embodiments described herein relate generally relate to an air conditioning system and an air conditioning method for managing a server room.

BACKGROUND

Recent increases in introduction of information technologies to various fields have been escalating the need for datacenter. The datacenter provides connection to network, maintenance and operation service, and the like for customers.

Generally, a server room such as a datacenter includes a plurality of servers, therefore a large amount of heat load is generated in the room. Accordingly, in order to allow the servers to normally operate, the server room needs to be properly air-conditioned and to be maintained within predetermined ranges of supply air conditions.

As one of the conventional technologies to cool the inside of server rooms, or rooms in which a plurality of computers are placed, there is an air conditioning system. The system sucks air from lower space of the room and blows the sucked air to the upper space so that the air flows into the tops of server racks.

Use of such a conventional technology can reduce the gradient of temperature within the room and furthermore can reduce variations in temperature of supply air, thus implementing efficient air-conditioning control.

DETAILED DESCRIPTION

According one embodiment, an air-conditioning system is for managing a server room, the server room having first and second spaces separated, in which a server is placed between the first and second spaces and supply air flown into the first space is heated by heat generation of the server and is flown out as return air through the second space. The air-conditioning system includes: an outside air introduction unit for introducing outside air and controlling an amount of the outside air introduced; a return air introduction unit for introducing the return air flown from the second space of the server room and controlling an amount of the return air introduced; a humidifier for humidifying at least one of the outside air and the return air; a cooler for cooing at least one of the outside air and the return air; a fan for causing the return air and outside air from the humidifier and the return air and outside air from the cooler to flow into the first space as the supply air and causing the return air to flow out from the second space; and a controller. The controller includes: an outside air state measurement value acquisition section for acquiring measurement values of temperature and humidity of the outside air; a control content setting section for setting control contents for generating supply air within previously set target ranges of temperature, absolute humidity, and relative humidity, based on the measurement values of the temperature and humidity of the outside air acquired by the outside air state measurement value acquisition section; and a control section for controlling a flow rate of the introduced outside air, a flow rate of the introduced return air, amounts of controlling the humidifier and the cooler, and an air volume of the fan, based on the control contents set by the control content setting section.

Hereinafter, a description is given of embodiments with reference to the drawings.

First Embodiment

<Configuration of Server Room Management System of First Embodiment>

Figure 1:
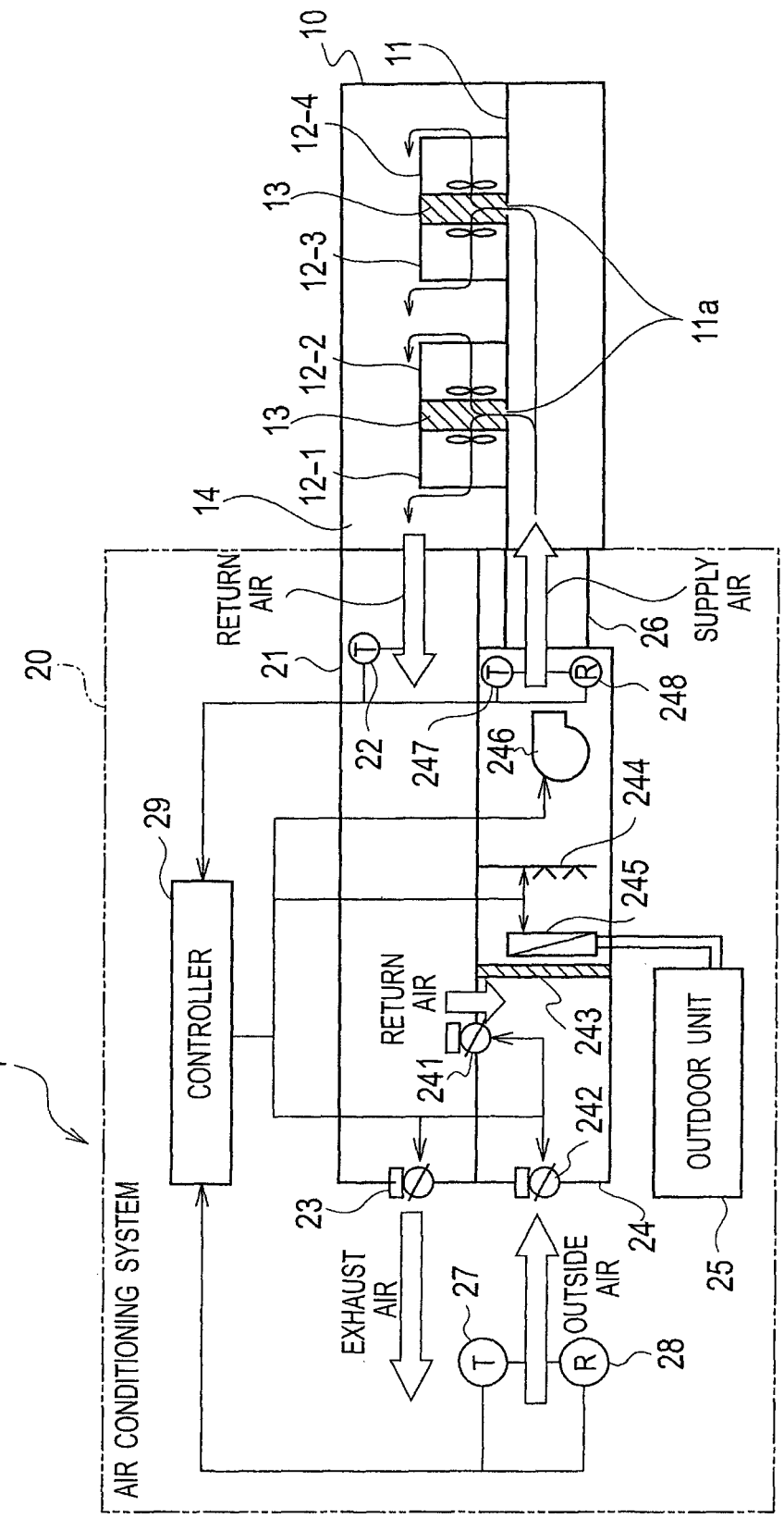
FIG. 1 is an entire view illustrating a configuration of an air-conditioning system according to first and second embodiments.

A description is given of a configuration of a server room management system according to the first embodiment referring to FIG. 1.

A server room management system 1 according to the first embodiment includes a server room 10 such as a datacenter and an air-conditioning system 20 performing air conditioning of the server room 10.

In the server room 10, a double floor 11 including a plurality of openings 11a is installed. On the double floor 11, a plurality of server racks 12-1 to 12-4 accommodating a plurality of servers (not illustrated) are installed. In the server room 10, with operation of fans of the installed servers or fans provided for the server racks 12-1 to 12-4, as indicated by arrows of FIG. 1, cold air flown into a section under the double floor 11 is sucked through the openings 11a in the double floor 11 into a section above the double floor 11. The configuration creates an airflow in the server room 10 so that the sucked cold air is heated by heat generated from the servers and is then flown out as return air. Due to the airflow, in the upper section above the double floor 11, cold areas 13 as a first space and a hot area 14 as a second space are formed. The cold areas 13 contain cold air which is sucked by the server racks 12-1 to 12-4, and the hot area 14 contains warm air which is blown out from the server racks 12-1 to 12-4. With this configuration, the heat generated by the servers is cooled by the cold air, so that the servers can normally operate.

The air-conditioning system 20 includes a return air duct 21, a return air temperature sensor 22, an exhaust dumber 23, an air handling unit 24, an outdoor unit 25, a supply air duct 26, an outside air temperature sensor 27, an outside air humidity sensor 28, and a controller 29.

The return air duct 21 is a tube through which air flows. The return air duct 21 connects the hot area 14 of the server room 10 and the air handling unit 24 of the air-conditioning system 20.

The return air temperature sensor 22 measures temperature of return air flown from the hot area 14 and sends the measurement value to the controller 29.

The exhaust dumber 23 regulates the flow rate of return air discharged from the return air duct 21 to the outside by an opening.

The air handling unit 24 includes a return air introduction dumber 241, an outside air introduction dumber 242, a filter 243, a humidifier 244, a cooling coil 245, a fan 246, a supply air temperature sensor 247, and a supply air humidity sensor 248. The return air introduction dumber 241 as a return air introduction unit regulates the flow rate of return air introduced through the return air duct 21 into the air handling unit 24 with an opening. The outside air introduction dumber 242 as an outside air introduction unit regulates the flow rate of outside air introduced into the air handling unit 24 with an opening. The filter 243 removes dust from the outside air introduced when the outside air introduction dumber 242 is opened and the return air introduced from the return air duct 21 when the return air introduction dumber 241 is opened. The humidifier 244 humidifies the outside air and return air with dust removed by the filter 243 if necessary. The cooling coil 245 as a cooler cools the outside air and return air with dust removed by the filter 243 if necessary to generate cold air. The fan 246 causes the cold air which is generated by being humidified by the humidifier 244 as appropriate and being cooled by the cooling coil 245 as appropriate to flow under the floor of the server room 10 through the supply air duct 26 into the cold areas 13. The supply air temperature sensor 247 measures temperature of the supply air to be flown into the server room 10 and sends the measurement value to the controller 29. The supply air humidity sensor 248 measures humidity of the supply air to be flown to the server room 10 and sends the measurement value to the controller 29.

The outdoor unit 25 is connected to the cooling coil 245 and supplies a refrigerant used to generate cold air at the cooling coil 245.

The supply air duct 26 is a tube through which air flows and connects the air handling unit 24 and the part under the floor which communicates with the cold areas 13 of the server room 10.

The outside air temperature sensor 27 measures the outside air temperature and sends the measurement value to the controller 29.

The outside air humidity sensor 28 measures the outside air humidity and sends the measurement value to the controller 29.

Figure 2:
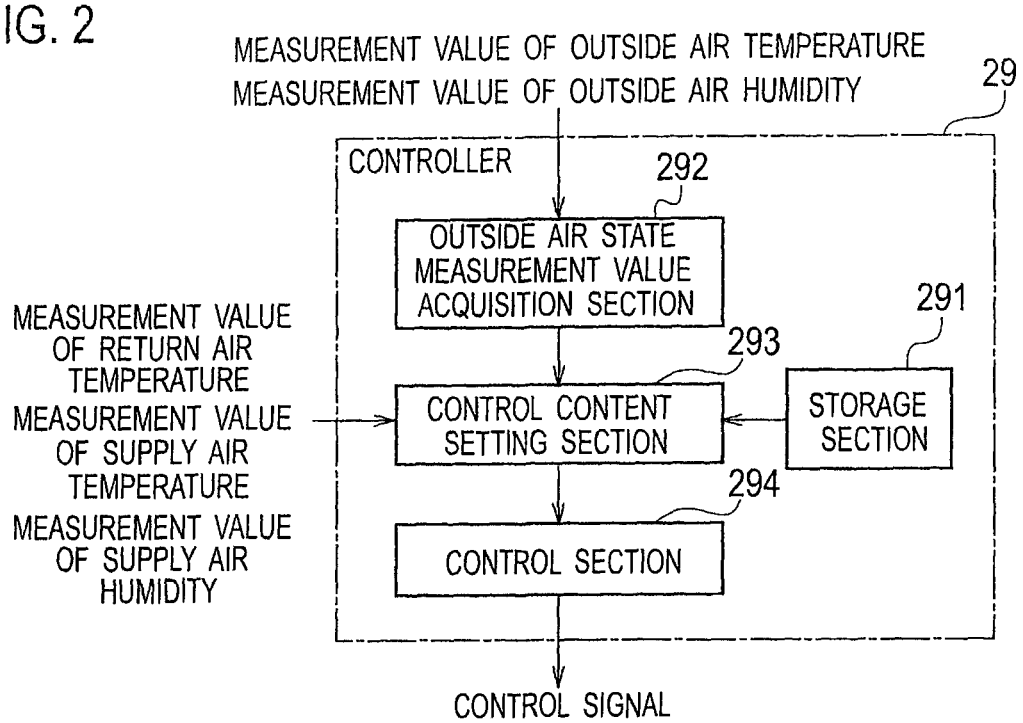
FIG. 2 is a block diagram illustrating a configuration of a controller of the air-conditioning system according to the first and second embodiments.

As illustrated in FIG. 2, the controller 29 includes a storage section 291, an outside air state measurement value acquisition section 292, a control content setting section 293, and a control section 294. The storage section 291 stores target ranges of temperature and humidity of supply air for the server room 10. The outside air state measurement value acquisition section 292 acquires the measurement value of outside air temperature measured by the outside air temperature sensor 27 and the measurement value of outside air humidity measured by the outside air humidity sensor 28. The control content setting section 293 sets control contents for generating supply air within the previously set temperature and humidity ranges based on the target ranges of temperature and humidity of supply air which are stored in the storage section 291. The control section 294 controls the operation of each device of the air-conditioning system 20 based on the control contents set by the control content setting section 293.

<Operation of Server Room Management System of First Embodiment>

Next, a description is given of an operation of the server room management system 1 according to the first embodiment.

In the first embodiment, the storage section 291 of the controller 29 of the server management system 1 stores the target ranges of temperature and humidity of supply air to the server room 10.

In the first embodiment, as the target ranges of temperature and humidity of supply air to the server room 10, the storage section 291 stores information including a target range of temperature of 18 to 27° C., a target range of absolute humidity of 0.0056 to 0.0107 kg/kg(DA), and a target range of relative humidity of not more than 60% according to the prescription (ASHRAE2008) of American Society of Heating, Refrigerating and Air-Conditioning Engineers (ASHRAE).

The description is given of the operation of the server room management system 1 when each device is controlled by the controller 29 with the target ranges of temperature and humidity of supply air stored in the storage unit 291.

First, the measurement values of temperature and humidity of outside air which are acquired by the outside air state measurement value acquisition section 292 are acquired by the control content setting section 293.

Next, in the control content setting section 293, the control contents for generating supply air within the previously set temperature and humidity ranges are set based on the target ranges of temperature and humidity of supply air which are stored in the storage section 291. The process of setting the control contents, which is executed by the control content setting section 293, is described in detail.

Figure 3:
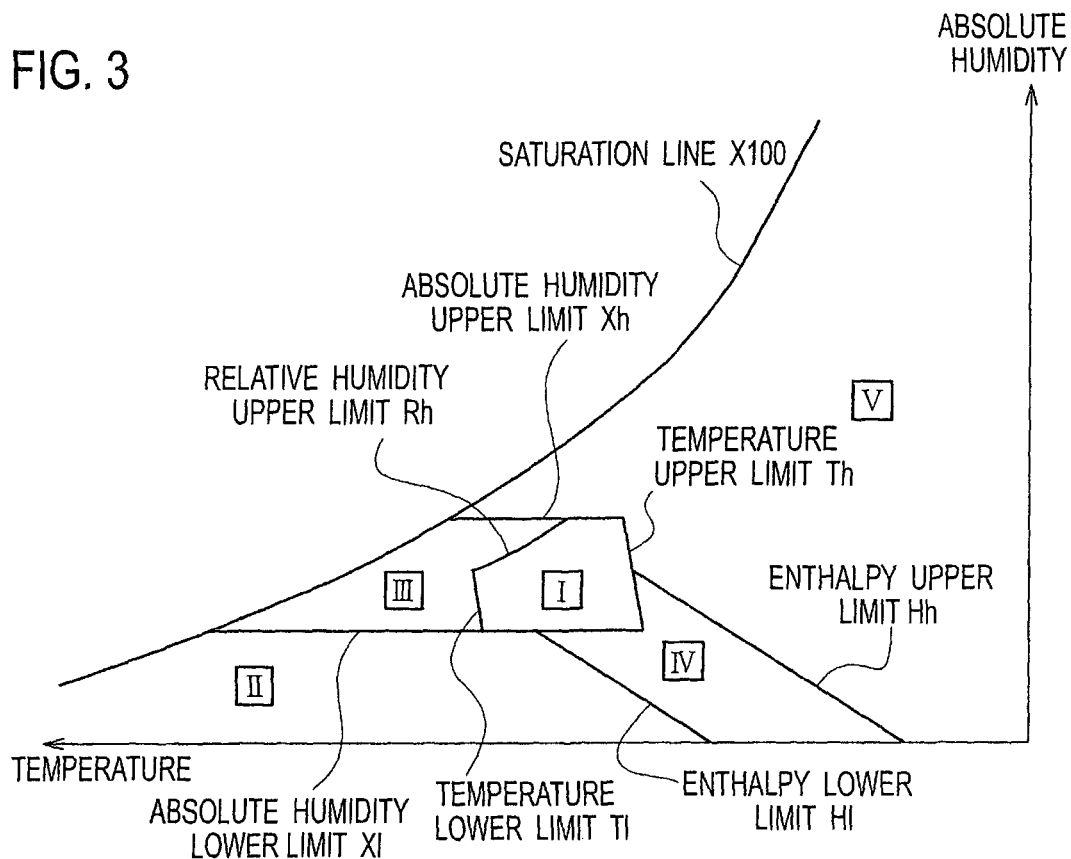
FIG. 3 is a graph illustrating state ranges of outside air on a psychrometric chart, the state ranges being classified by the controller of the air-conditioning system according to the first and second embodiments.

First, it is determined, based on the measurement values of the acquired temperature and humidity of outside air, which zone on a psychrometric chart, which are sectioned as illustrated in FIG. 3, the current state of outside air corresponds to. Herein, the psychrometric chart is a diagram giving the state of humid air based on the temperature, absolute humidity, relative humidity, enthalpy, and the like.

In the psychrometric chart of FIG. 3, the state of air having a relative humidity of not more than 100% (saturation) indicated by a saturation line X100 is categorized into zones I to V representing five air state ranges described below, based on the values indicated in the aforementioned target ranges of temperature and humidity and the upper and lower limits of enthalpy of the air state corresponding to the target ranges of temperature and humidity. In the first embodiment, the upper and lower limits of enthalpy corresponding to the aforementioned target ranges of temperature and humidity are assumed to be 50 and 35 kJ/kg, respectively.

Zone I (First air state range): The zone I refers to a range defined by the target ranges of temperature, absolute humidity, and relative humidity and satisfies the following formula (1) in the psychrometric chart of FIG. 3.

$$(\text{Temperature } T: 18° C. <= T <= 27° C.) \cap (\text{Absolute Humidity } X: 0.0056 \text{ kg/kg(DA)} <= X <= 0.0107 \text{ kg/kg(DA)}) \cap (\text{Relative Humidity } R: R <= 60\%) \quad (1)$$

Zone II (Second air state range): The zone II refers to a range below the lower limit of the target range of absolute humidity and below the lower limit of the target range of enthalpy and satisfies the following formula (2) in the psychrometric chart of FIG. 3.

$$\text{(Absolute Humidity } X: X<0.0056 \text{ kg/kg(DA))} \cap \text{(Specific Enthalpy } H: H<35 \text{ kJ/kg)} \quad (2)$$

Zone III (third air state range): The zone III refers to a range within the target range of absolute humidity and below the lower limit of the target range of temperature or above the upper limit of the target range of relative humidity and satisfies the following formula (3) in the psychrometric chart of FIG. 3.

$$\text{(Absolute Humidity } X: 0.0056 \text{ kg/kg(DA)} <= X <= 0.0107 \text{ kg/kg(DA))} \cap \{\text{(Temperature } T: T<18°\text{ C.)} \cup \text{(Relative Humidity } R: R>=60\%)\} \quad (3)$$

Zone IV (Fourth air state range): The zone IV refers to a range within the target range of enthalpy and below the lower limit of the target range of absolute humidity or above the upper limit of the target range of temperature and satisfies the following formula (4) in the psychrometric chart of FIG. 3.

$$\text{(Specific Enthalpy } H: 35 \text{ kJ/kg}<=H<=50 \text{ kJ/kg)} \cap \{\text{(Absolute Humidity } X: X<0.0056 \text{ kg/kg(DA))} \cup \text{((Temperature T: } T>27°\text{ C.)}\} \quad (4)$$

Zone V (Fifth air state range): The zone V is a range other than the aforementioned zones I to IV.

If it is determined which one of these zones I to V the current state of outside air corresponds to, the control contents are determined for the determined zone as follows by the control content setting section 293 using the measurement values of temperature and humidity of outside air which are acquired by the outside air state measurement value acquisition section 292, the measurement value of temperature of return air which is measured by the return air temperature sensor 22, the measurement value of temperature of supply air which is measured by the supply air temperature sensor 247, and the measurement value of humidity of supply air which is measured by the supply air humidity sensor 248. Herein, it is assumed that the object to be controlled is sensible heat load due to heat generated from the servers in the server room 10 and no latent heat load due to human breathing or the like is generated. Accordingly, it is assumed that the humidity of return air is equal to the measurement value of humidity of supply air which is measured by the supply air humidity sensor 248.

Control Contents for Zone I: When the current state of outside air is within the zone I, the outside air can be directly used as supply air. Accordingly, the control contents are determined so that the outside air introduction ratio α is set to 1 by fully opening the exhaust dumper 23, closing the return air introduction dumper 241, and fully opening the outside air introduction dumper 242. At this time, the humidification process by the humidifier 244 and the process of cooling the air mixture by the cooling coil 245 are not performed.

Control Contents for Zone II: When the current state of outside air is within the zone II, the control contents are determined so that the return air is mixed with outside air to be heated and humidified. To be specific, the control contents are determined so that the openings of the exhaust dumper 23, the return air introduction dumper 241, and the outside air introduction dumper 242 are adjusted between 0 and 100% according to the outside air introduction ratio α and the air mixture is subjected to a necessary amount of humidification by the humidifier 244.

At this time, the outside air introduction ratio α is adjusted based on the measurement values of temperature of outside air and temperature of return air so that the temperature and humidity of the air mixture as supply air is within a range previously set as the target ranges of temperature and humidity which are stored in the storage section 291.

The absolute humidity X of the air including the outside air and return air mixed at the adjusted outside air introduction ratio α is expressed using a measurement value Xo of absolute humidity of the outside air, a measurement value Xr of absolute humidity of the return air, and the outside air introduction ratio α as the following formula (5).

$$X = Xo \times \alpha + Xr \times (1-\alpha) \quad (5)$$

At this time, in order to use the air mixture as supply air having a temperature and a humidity within the target ranges, the air mixture needs to be humidified by a difference (Xs0−X) between a target value Xs0 of absolute humidity of the supply air and the absolute humidity X of the air mixture. The amount of humidification necessary to increase the humidity by the above difference is Fs x (Xs0−X) where Fs is a flow rate of supply air. The control contents for a valve (not illustrated) controlling the flow rate of water of the humidifier are determined so that the above amount of humidification is provided. At this time, the process of cooling the air mixture by the cooling coil 245 is not performed.

Although the amount of humidity added at humidification after the outside air and return air are mixed is determined as described above, the return air may be previously humidified so that the absolute humidity thereof is {Xr+(X−Xs0)/(1−α)}. The absolute humidity of supply air after mixing is therefore set to Xs0. In this case, the need for humidification of supply air after mixing can be eliminated.

The outside air introduction ratio α in this case is expressed as Formula (6) where the measurement value of temperature of outside air is To °C.; the return air temperature after mixing is Tr2° C.; and the target value of temperature of supply air is Ts0° C.

$$\alpha = (Tr2 - Ts0)/(Tr2 - To) \quad (6)$$

The control contents for Zone III: When the current state of outside air is within the zone III, the control contents are determined so that the outside air is mixed with return air to be heated. To be specific, the control contents are determined so that the openings of the exhaust dumper 23, the return air introduction dumper 241, and the outside air introduction dumper 242 are adjusted between 0 to 100% according to the outside air introduction ratio α.

The outside air introduction ratio α in this case is expressed by the formula (7) where the measurement value of temperature of outside air is To ° C.; the measurement value of temperature of supply air is Tr ° C.; and the target value of temperature of supply air is Ts0° C.

$$\alpha = (Tr - Ts0)/(Tr - To) \quad (7)$$

At this time, the process of humidification by the humidifier 244 and the process of cooling the air mixture by the cooling coil 245 are not performed.

Control Contents for Zone IV: When the current state of outside air is within the zone IV, the control contents are determined so that the outside air is humidified. To be specific, the control contents are determined so that the outside air introduction ratio α is set to 1 by fully opening the exhaust dumper 23, closing the return air introduction dumber 241, and fully opening the outside introduction dumper 242 and that the necessary amount of humidification is performed by the humidifier 244.

In this case, the necessary amount of humidity is Xs0−Xo where Xo is the measurement value of absolute humidity of outside air and Xs0 is the target value of absolute humidity of supply air. At this time, the temperature of outside air decreases from To ° C. to T ° C. due to humidification. If the target value Ts0° C. of temperature of supply air is lower than T° C., the cooling process is performed by the cooling coil 245 so that the temperature of outside air reaches the target value of temperature of supply air.

Control Contents for Zone V: When the current state of outside air is located in the zone V, the control contents are determined so that the return air is cooled. To be specific, the control contents are determined so that the outside air introduction ratio α is set to 0 by closing the exhaust dumper 23, fully opening the return air introduction dumber 241, and closing the outside introduction dumper 242 and that the cooling/dehumidifying process is performed by the cooling coil 245. At this time, the humidification process by the humidifier 244 is not performed.

Even when the current state of outside air is within the zone V, if there is an operator in the server room 10 and ventilation is necessary, the lower limit of the outside air introduction ratio may be previously set so that a certain flow rate of outside air is introduced.

When the control contents are set in the control content setting section 293 by the aforementioned process, based on the set control contents, the control section 294 generates a control signal to control the opening of the exhaust dumper 23, the opening of the return air introduction dumper 241, the opening of the outside air introduction dumper 242, control amounts of the humidifier 244 and cooling coil 245, and the air volume of the fan 246 and sends the same to each device. With this configuration, the air-conditioning system 20 is controlled to generate supply air with a temperature and a humidity within the target ranges.

As described above, according to the first embodiment, the control contents of the air-conditioning system 20 are changed according to the state of outside air so that the outside air is utilized as much as possible and the control suitable to server management is performed. It is therefore possible to perform air-conditioning control for server management with a high energy saving effect.

Second Embodiment

<Configuration of Server Room Management System of Second Embodiment>

The configuration of a server room management system 2 according to a second embodiment is the same as that of the server room management system according to the first embodiment, and a detailed description is therefore omitted.

<Operation of Server Room Management System of Second Embodiment>

In the operation of the server room management system 2 according to the second embodiment, at setting of the control contents by the control content setting section 293, optimal target values of temperature and humidity of supply air are calculated within the target ranges of temperature and humidity stored in the storage section 291, and the control contents are set on these target values so as to provide a high energy saving effect.

A description is given of the process of calculating the target values of temperature and humidity of supply air which can minimize the energy consumption as the optimal target values of temperature and humidity of supply air in the second embodiment.

First, energy consumption E by the devices controlled by the controller 29 can be expressed by the following formula (8).

$$E = gcol\left(\frac{Fs \times}{(\alpha H0 + (1-\alpha)Hr - Hs)}\right) + gfan(Fs) + ghum(Fw) \quad (8)$$

Herein, Fs is the flow rate of supply air; Fw is the flow rate of water for humidification; α is the outside air introduction ratio; Ho is specific enthalpy of outside air; Hr is specific enthalpy of return air; Hs is specific enthalpy of supply air; gcol is a function indicating the relation between the cooling amount by the cooling coil and energy consumption thereof; gfan is a function indicating the relation between the flow rate of supply air and the energy consumption of the fan; and ghum is a function indicating the relation between the flow rate of water for humidification and the energy consumption of the humidifier.

Among these values, the flow rate Fs of supply air, the flow rate Fw of water for humidification, the outside air introduction ratio α, the specific enthalpy Ho of outside air (calculated based on the measurement values of temperature and absolute humidity of outside air), the specific enthalpy Hr of return air (calculated based on the measurement values of temperature of return air and absolute humidity of supply air), and the specific enthalpy Hs of supply air (calculated based on the measurement values of temperature and absolute humidity of supply air) can be measured or can be calculated based on the measurement values. Herein, it is assumed that the object of the air conditioning control is sensible load due to heat generated from the servers within the server room 10 and no latent heat load due to human breathing and the like is generated. Accordingly, the absolute humidity of return air is equal to the measurement value of the humidity of supply air measured by the supply air humidity sensor 248.

The function gcol indicating the relation between the amount of cooling by the cooling coil and the energy consumption thereof, the function gfan indicating the relation between the flow rate of supply air and the energy consumption of the fan, and the function ghum indicating the relation between the flow rate of water for humidification and the energy consumption of the humidifier are the functions representing the characteristics of the devices constituting the controller 29 and are known. Accordingly, the energy consumption E by the controller 29 can be calculated based on these values.

The controller 29 according to the second embodiment controls the temperature and humidity of supply air through one or some of the processes including: the process of controlling the outside air introduction ratio α by adjusting the openings of the exhaust dumper 23, the return air introduction dumper 241, and the outside air introduction dumper 242; the process of controlling the amount of cooling supply air by the cooling coil 245; and the process of controlling the amount of humidification by the humidifier 244. The necessary amounts of controlling the exhaust dumper 23, the return air introduction dumper 241, the outside air introduction dumper 242, the cooling coil 245, and the humidifier 244 are therefore determined by setting the target values of temperature and absolute humidity of supply air.

The flow rate Fs of supply air is calculated by the following formula (9) using a measurement value Tr of temperature of return air, a measurement value Ts0 of temperature of supply air, a specific heat C of air, and an amount Q of heat generated by the servers.

$$Fs = Q/C/(Tr-Ts0) \quad (9)$$

In such a way, given the target value Ts0 of temperature of supply air, the target value Xs0 of absolute humidity of supply air, and the flow rate Fs of supply air, the necessary energy consumption E can be calculated using the aforementioned formula (8).

In other words, air-conditioning control within the server room 10 using the controller 29 according to the second embodiment operates with a theoretically minimum energy in the case of a combination of the temperature, humidity, and flow rate of supply air which can minimize the energy consumption E calculated by the formula (8).

Accordingly, the target value Ts0 of temperature of supply air and the target value Xs0 of absolute humidity of supply air which can minimize the energy consumption are previously calculated for various conditions of temperature and humidity of outside air and server load to create an outside air condition/supply air condition relation table representing the relation thereamong. The created table is then stored in the control content setting section 293. With this configuration, the conditions of supply air which can minimize the energy consumption can be calculated based on the measured conditions of outside air and the server load.

Herein, the server load Q may be calculated using the power consumption of the servers or may be calculated using the following formula (10). At calculation using the following formula (10), the control content setting section 293 is configured to execute the process of calculating the server load Q before the process of calculating the conditions of supply air based on the outside air condition/supply air condition relation table.

$$Q = Fs \times C \times (Tr - Ts) \quad (10)$$

Herein, Q is the load of an object to be air-conditioned; Fs is the flow rate of supply air; C is the specific heat of air; Tr is the measurement value of temperature of return air; and Ts is the measurement value of temperature of supply air.

The control contents are determined as described in the first embodiment by using the target value Ts0 of temperature of supply air and the target value Xs0 of absolute humidity of supply air which are calculated as described above. The target value Ts0 of temperature of supply air and the target value Xs0 of humidity of supply air are properly changed according to the change of the state of the outside air for highly efficient air-conditioning control. With such a configuration, air-conditioning control with a high energy saving effect can be implemented.

Other Embodiments

A description is given of another embodiment in the case where the current state of outside air is within the zone I.

In the description of the aforementioned first and second embodiments, when the state of outside air is within the zone I, the humidification process by the humidifier 244 and the cooling process by the cooling coil 245 are not performed. However, the outside air may be cooled by the cooling coil 245 to allow the measurement values of temperature of supply air to fall in the zone I when the temperature of the introduced outside air rises because of heat generation due to the operating fan 246 of the air handling unit 24 or the like.

Next, a description is given of another embodiment in the case where the current state of outside air is within the zone II.

Figure 4:
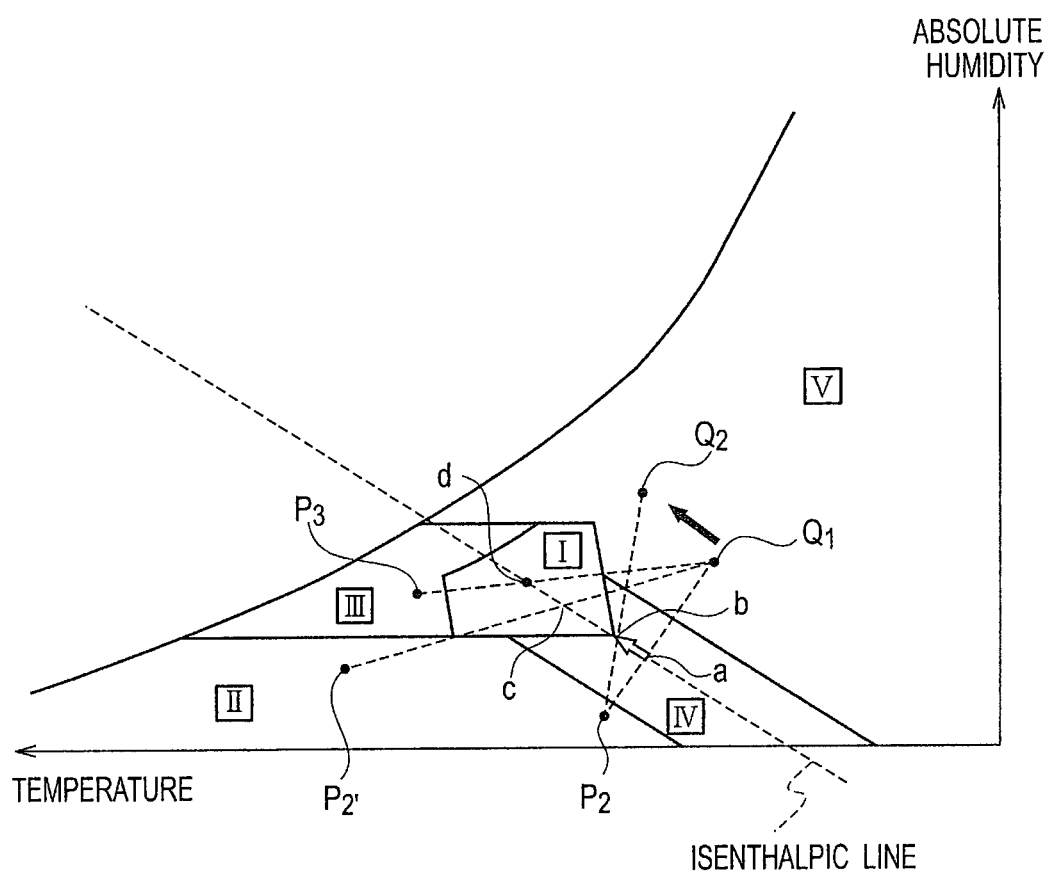
FIG. 4 is an explanatory view illustrating changes in the state of air on the psychrometric chart in the case where an air-conditioning system according to another embodiment performs air-conditioning control.

As illustrated in FIG. 4, it is assumed that the measurement values of outside air correspond to the state indicated by a point $P_2$ within the zone II and the measurement values of return air correspond to the state indicated by a point $Q_1$. In this case, the return air is mixed with the outside air to increase in temperature. The state of the air mixture corresponds to any position on the line connecting the points $P_2$ and $Q_1$ in the psychrometric chart of FIG. 4, and the point is determined by the outside air introduction ratio α.

Accordingly, a point of intersection between the line connecting the points $P_2$ and $Q_1$ and an isenthalpic line is selected (a point "a" in FIG. 4). The isenthalpic line has an enthalpy equal to that at a point where the difference in absolute humidity from the target value Xs0 of absolute humidity of supply air is minimized in a range indicated by the zone I (a point "b" in FIG. 4). The outside air introduction ratio α corresponding to the position of the point "a" is then calculated. This can implement preferable control with the amount of humidification minimized.

The opening of each dumper is controlled so that the introduced outside air and the return air are mixed at the thus-calculated ratio. The air mixture is then subjected to the humidification process by the humidifier 244 so as to have a state corresponding to the position of the point "b" in the zone I. With this configuration, it is possible to generate supply air having a temperature and a humidity in the target ranges at the minimum energy consumption.

Similarly, it is assumed that the measurement values of outside air correspond to the state indicated by the point $P_2$ within the zone II and the measurement values of return air correspond to the state indicated by the point $Q_1$. In this case, first, the return air is subjected to the humidification process by the humidifier 244 so that the state thereof at the point $Q_1$ changes to the state at a point $Q_2$. Then, the opening of each dumper is controlled so that the return air in the state indicated by the point $Q_2$ and the outside air in the state indicated by the point $P_2$ are then mixed at the ratio calculated as described above. With this configuration, supply air having a temperature and a humidity within the target ranges can be generated more efficiently. This is because air in the state indicated by the point $Q_1$, which has a higher temperature than air at the point "a", is more likely to absorb moisture and can be humidified more efficiently than the air in the state indicated by the point "a".

In a similar manner, it is assumed the measurement values of outside air correspond to the state indicated by a point $P_2'$ within the zone II and the measurement values of return air correspond to the state indicated by the point $Q_1$. Also in this case, a point of intersection between the line connecting the points $P_2'$ and $Q_1$ and the aforementioned isenthalpic line is selected (the point "c" in FIG. 4), and the temperature and absolute humidity of the state corresponding to the point "c" are set as the target value Ts0 of temperature of supply air and the target value Xs0 of absolute humidity of supply air, respectively, for the air conditioning control. This can implement preferable control.

Herein, the energy consumption does not change even if the target value Ts0 of temperature of supply air and the target value Xs0 of absolute humidity of supply air are set to temperature and absolute humidity of the state corresponding to any position on the line connecting the points $P_2'$ and $Q_1$. However, according to the aforementioned process, the target value Ts0 of temperature of supply air and the target value Xs0 of absolute humidity of supply air can be continuously changed isenthalpically even when the state of outside air successively changes between the state requiring humidification and the state not requiring humidification. Accordingly, the configuration has an advantage of implementing stable control.

Next, a description is given of still another embodiment in the case where the current state of outside air is within the zone III.

Figure 5:
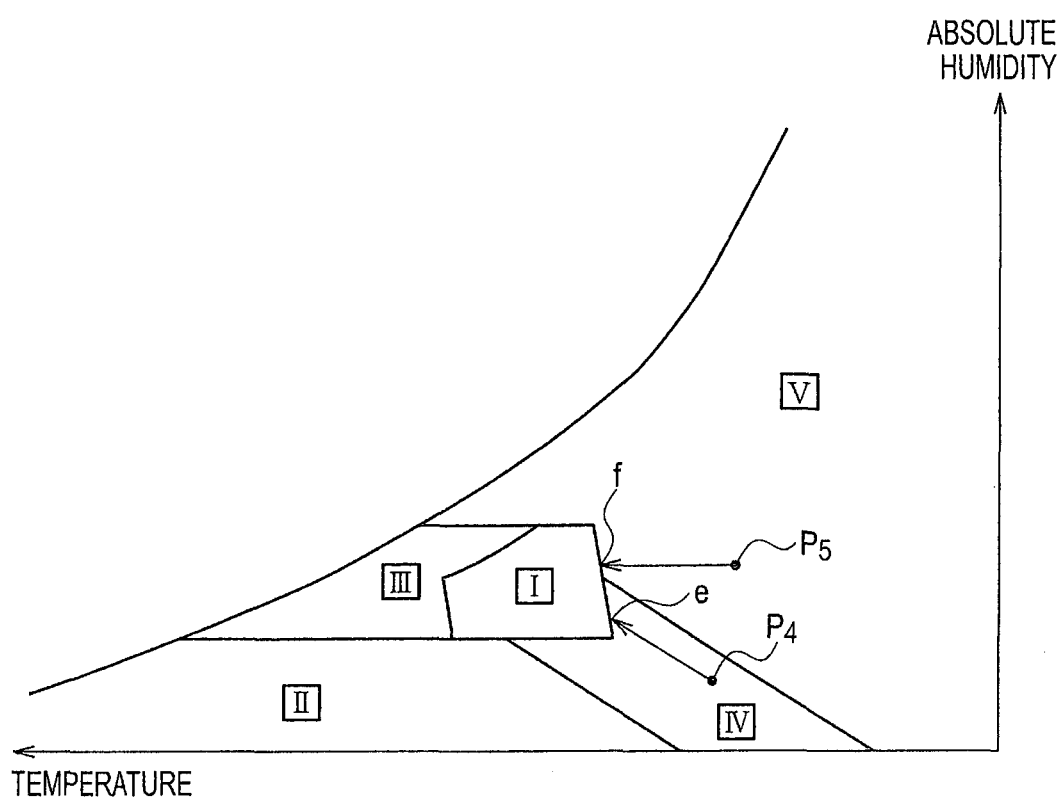
FIG. 5 is an explanatory view illustrating changes of the state of air on the psychrometric chart in the case where an air-conditioning system according to still another embodiment performs air-conditioning control.

As illustrated in FIG. 5, it is assumed that the measurement values of outside air correspond to the state at a point $P_3$ within the zone III and the measurement values of the return air correspond to the state at the point $Q_1$. In this case, similarly, a point of intersection between the line connecting the point $P_3$ and the point $Q_1$ and the aforementioned isenthalpic line is selected (a point "d" in FIG. 5). The temperature and absolute humidity of the state corresponding to the position of the point "d" are then set as the target value Ts0 of temperature of supply air and the target value Xs0 of absolute humidity of supply air, respectively, for the air conditioning control. This can implement preferable control.

Herein, the energy consumption does not change if the target value Ts0 of temperature of supply air and the target value Xs0 of absolute humidity of supply air are set to the temperature and absolute humidity of the state corresponding to any position on the line connecting the points $P_3$ and $Q_1$. However, according the aforementioned process, the target value Ts0 of temperature of supply air and the target value Xs0 of absolute humidity of supply air can be continuously changed isenthalpically even when the state of outside air successively changes between the state requiring humidification and the state not requiring humidification. Accordingly, the configuration has an advantage of implementing stable control.

Next, a description is given of still another embodiment in the case where the current state of outside air is located within the zone IV.

In the description of the aforementioned first and second embodiments, when the state of outside air is within the zone IV, only outside air is introduced and is subjected to the humidification process for air conditioning. At this time, the target value Ts0 of temperature of supply air and the target value Xs0 of absolute humidity of supply air are respectively set to temperature and absolute humidity of the state corresponding to a point at which the absolute humidity has the minimum difference from that of the target value Xs0 of absolute humidity of supply air within the zone I and the enthalpy is the same as that of the current state of outside air. This can implement preferable control.

For example, it is assumed that the measurement values of outside air correspond to the state at a point $P_4$ in the zone IV as illustrated in FIG. 5. In this case, a point on the isenthalpic line passing through the point $P_4$ in the zone I is selected so as to minimize the difference between the absolute humidity at the point and the target value Xs0 of absolute humidity of supply air (a point "e" in FIG. 5). The temperature and absolute humidity of the state corresponding to the point "e" are set as the target value Ts0 of temperature of supply air and the target value Xs0 of absolute humidity of supply air for air-conditioning control. Accordingly, supply air with a temperature and a humidity within the target ranges can be generated at the minimum energy consumption.

Next, a description is given of still another embodiment in the case where the current state of outside air is within the zone V.

In the description of the aforementioned first and second embodiments, when the state of outside air is located within the zone V, only return air is introduced and is subjected to the cooling process for air conditioning control. When the state of outside air is in the zone V, if the current absolute humidity of the outside air is not more than the upper limit of the target range of absolute humidity of supply air, the current absolute humidity of the outside air is selected as the target value Xs0 of absolute humidity of supply air, and the upper limit of the target range of temperature of supply air is selected as the target value Ts0 of temperature of supply air. Accordingly, preferable air-conditioning control can be implemented by introducing only outside air and performing the cooling process for the same.

For example, it is assumed that the measurement values of outside air correspond to the state at a point $P_5$ in the zone V as illustrated in FIG. 5. In this case, a point of the upper limit of the target range of temperature of supply air is selected on a line of constant absolute humidity passing through the point $P_5$ (a point "f" in FIG. 5). The temperature and absolute humidity of the state corresponding to the point "f" are set as the target value Ts0 of temperature of supply air and the target value Xs0 of absolute humidity of supply air for air-conditioning control. Accordingly, supply air with a temperature and a humidity within the target ranges can be generated at the minimum energy consumption.

In the description of the aforementioned embodiments, the target value Ts0 of temperature of supply air and the target value Xs0 of absolute humidity of supply air are set so as to minimize the energy consumption. However, the air-conditioning control may be performed according to a combination of the supply air temperature, supply air absolute humidity, and flow rate of supply air which can minimize a cost Cost corresponding to the energy consumption which is calculated by using the following formula (11) instead of the above formula (8).

$$\text{Cost} = a1 \times gcol(Fs \times (\alpha H0 + (1 - \alpha)Hr - Hs)) + \qquad (11)$$
$$a2 \times gfan(Fs) + a3 \times ghum(Fw) + a4 \times Fw$$

Herein, a1 is a relation between the energy consumption of the cooling coil and the cost thereof; a2 is a relation between the energy consumption of the fan and the cost thereof; a3 is relation between the energy consumption concerning humidification and the cost thereof; and a4 is a relation between the flow rate of water for humidification and the cost thereof. The other symbols are the same as those of the formula (8). These a1 to a4 may be either coefficients or functions and are assumed to be general characteristics of cost-energy consumption of a cooling coil and a freezer, cost-energy consumption of a fan, cost-energy consumption of a humidifier, and cost-water consumption.

As described in the second embodiment, the outside air condition/supply air condition relation table previously held by the control content setting section 293 may include the target value Ts0 of temperature of supply air and the target value Xs0 of absolute humidity of supply air which can minimize the cost for energy consumption (necessary expense) for the various conditions of outside air temperature, outside air humidity, and server load.

By performing air conditioning control using the target value Ts0 of temperature of supply air and the target value Xs0 of absolute humidity of supply air which can minimize the cost, the expense for operating the server room management system can be reduced.

In the aforementioned embodiments, the target ranges of temperature and humidity of supply air are the target ranges according to the prescription of ASHRAE but are not limited to the same. The target ranges of temperature and humidity may be other target ranges according to the state of an object to be controlled. Moreover, some or all of the zones separated as illustrated in FIG. 3 may overlap each other.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An air-conditioning system for managing a server room, the server room having first and second spaces separated, in which a server is placed between the first and second spaces and supply air flown into the first space is heated by heat generation of the server and is flown out as return air through the second space, the air-conditioning system comprising:
   an outside air introduction unit for introducing outside air and controlling an amount of the outside air introduced;
   a return air introduction unit for introducing the return air flown from the second space of the server room and controlling an amount of the return air introduced;
   a humidifier for humidifying at least one of the outside air and the return air;
   a cooler for cooing at least one of the outside air and the return air;
   a fan for causing the return air and outside air from the humidifier and the return air and outside air from the cooler to flow into the first space as the supply air and causing the return air to flow out from the second space; and
   a controller comprising:
   an outside air state measurement value acquisition section for acquiring measurement values of temperature and humidity of the outside air;
   a control content setting section configured to respond to the plurality of air state ranges and configured to determine a selected air state range from among the plurality of air state ranges based on the measurement values of the temperature and humidity of the outside air acquired by the outside air state measurement value acquisition section, the plurality of air state ranges including:
   a first air state range where a state of the outside air is within a temperature target range of the supply air, within an absolute humidity target range of the supply air, and within a relative humidity target range of the supply air;
   a second air state range where the state of the outside air is less than a lower limit of the absolute humidity target range-of the supply air, and less than a lower limit of an enthalpy target range corresponding to the temperature target range of the supply air and the absolute humidity target range of the supply air;
   a third air state range where the state of the outside air is within the absolute humidity target range of the supply air, and less than a lower limit of the temperature target range of the supply air or not less than an upper limit of the relative humidity target range of the supply air;
   a fourth air state range where the state of the outside air is within the enthalpy target range corresponding to the temperature target range of the supply air and the absolute humidity target range of the supply air, and less than a lower limit of the absolute humidity target range of the supply air or greater than an upper limit of the temperature target range of the supply air; and
   a fifth air state range where the state of the outside air is out of the first to fourth air state ranges; and
   configured to set control contents corresponding to the selected air state range for generating the supply air within the temperature target range of the supply air, within the absolute humidity target range of the supply air, and within the relative humidity target range of the supply air; and
   a control section for controlling a flow rate of the introduced outside air, a flow rate of the introduced return air, amounts of controlling the humidifier and the cooler, and an air volume of the fan, based on the control contents set by the control content setting section.

2. The air-conditioning system of claim 1, wherein the control contents setting section
   sets the control contents to minimize the flow rate of the return air if determining that the state of the outside air corresponds to the first air state range;
   sets the control contents to mix the return air and the outside air at a predetermined ratio by adjusting flow rates of the introduced return air and the outside air and perform a necessary amount of humidification by the humidifier for the supply air if determining that the state of the outside air corresponds to the second air state range;
   sets the control contents to mix the return air and the outside air at a predetermined ratio by adjusting the flow rates of the introduced return air and the outside air if determining that the state of the outside air corresponds to the third air state range;
   sets the control contents to minimize the flow rate of the return air and perform a necessary amount of humidification for the supply air by the humidifier if determining that the state of the outside air corresponds to the fourth air state range; and
   sets the control contents to minimize the flow rate of the introduced outside air and perform cooling for the supply air by the cooler if determining that the state of the outside air corresponds to the fifth air state range,
   based on the measurement values of the temperature and humidity of the outside air acquired by the outside air state measurement value acquisition section.

3. The air-conditioning system of claim 2, wherein the control contents setting section sets the control content to mix the outside air and the return air after the return air is subjected to the necessary amount of humidification by the humidifier if determining that the state of the outside air corresponds to the second air state range, based on the measurement values of the temperature and humidity of the outside air acquired by the outside air state measurement value acquisition section.

4. The air-conditioning system of claim 2, wherein the control contents setting section sets the control contents to further perform cooling for the supply air by the cooler if determining that the state of the outside air corresponds to the fourth air state range, based on the measurement values of the temperature and humidity of the outside air acquired by the outside air state measurement value acquisition section.

5. The air-conditioning system of claim 2, wherein the control contents setting section controls the flow rate of the introduced outside air to the lower limit of the previously set outside air introduction ratio if determining that the state of the outside air corresponds to the fifth air state range, based on the measurement values of the temperature and humidity of the outside air acquired by the outside air state measurement value acquisition section.

6. The air-conditioning system of claim 1, wherein the control contents setting section calculates a target temperature and a target humidity of the supply air which minimize energy consumption, based on the measurement values of the temperature and humidity of the outside air acquired by the outside air state measurement value acquisition section, and sets the control contents based on the calculated target temperature and humidity of the supply air.

7. The air-conditioning system of claim 6, wherein
the control contents setting section
previously holds a table representing a correspondence relationship between temperature and humidity of the outside air and the target temperature and humidity of the supply air which minimize the energy consumption;
calculates, from the table, the target temperature and humidity of the supply air which minimize the energy consumption, corresponding to the measurement values of the temperature and humidity of the outside air acquired by the outside air state measurement value acquisition section; and
sets the control contents based on the calculated target temperature and humidity of the supply air.

8. The air-conditioning system of claim 1, wherein
the control contents setting section calculates a target temperature and a target humidity of the supply air which minimize necessary cost for energy consumption, based on the measurement values of the temperature and humidity of the outside air acquired by the outside air state measurement value acquisition section, and sets the control contents based on the calculated target temperature and humidity of the supply air.

9. The air-conditioning system of claim 8, wherein
the control contents setting section
previously holds a table representing a correspondence relationship between temperature and humidity of the outside air and the target temperature and humidity of the supply air which minimize the necessary cost for energy consumption;
calculates, from the table, the target temperature and humidity of the supply air which minimize the necessary cost, corresponding to the measurement values of the temperature and humidity of the outside air acquired by the outside air state measurement value acquisition section; and
sets the control contents based on the calculated target temperature and humidity of the supply air.

10. A method of controlling an air-conditioning system for managing air conditioning of a server room, the server room connected by a return air duct and a supply air duct to a server room, the server room including first and second spaces separated and accommodating a plurality of servers placed between the first and second spaces, an airflow formed in the server room in which cold air flown into the first space is heated due to heat generation by the servers and is then flown out as return air through the second space, the method comprising:
acquiring, via a controller configured to respond to a plurality of air state ranges, measurement values of temperature and humidity of outside air;
determining, via the controller, a selected air state range from among the plurality of air state ranges based on the measurement values of the temperature and humidity of the outside air, the plurality of air state ranges including:
a first air state range where a state of the outside air is within a temperature target range of the supply air, within an absolute humidity target range of the supply air, and within a relative humidity target range of the supply air;
a second air state range where the state of the outside air is less than a lower limit of the absolute humidity target range of the supply air, and less than a lower limit of an enthalpy target range corresponding to the temperature target range of the supply air and the absolute humidity target range of the supply air;
a third air state range where the state of the outside air is within the absolute humidity target range of the supply air, and less than a lower limit of the temperature target range of the supply air or not less than an upper limit of the relative humidity target range of the supply air;
a fourth air state range where the state of the outside air is within the enthalpy target range corresponding to the temperature target range of the supply air and the absolute humidity target range of the supply air first air state range, and less than a lower limit of the absolute humidity target range of the supply air or greater than an upper limit of the temperature target range of the supply air; and
a fifth air state range where the state of the outside air is out of the first to fourth air state ranges;
setting, via the controller, control contents corresponding to the selected air state range for generating the supply air within the temperature target range of the supply air, within the absolute humidity target range of the supply air, and within the relative humidity target range of the supply air;
setting, via the controller, control contents corresponding to the selected air state range for generating the supply air within the temperature target range of the supply air, within the absolute humidity target range of the supply air, and the relative humidity target range of the supply air; and
controlling, via the controller, a flow rate of the introduced outside air, a flow rate of the introduced return air which is flown from the second space to the return air duct, an amount of controlling a humidifier humidifying at least one of the introduced outside air and return air, an amount of controlling a cooler cooling at least one of the introduced outside air and return air, and a flow rate of a fan causing the air humidified by the humidifier and the air cooled by the cooler to flow through the air supply duct to the first space as the supply air, based on the set control contents.

* * * * *